United States Patent
Dowhower

(10) Patent No.: US 10,676,809 B2
(45) Date of Patent: Jun. 9, 2020

(54) METHODS AND SYSTEMS FOR GENERATING PATTERNS ON FLEXIBLE SUBSTRATES

(71) Applicant: Lockheed Martin Corporation, Bethesda, MD (US)

(72) Inventor: Kevie Overton Dowhower, Lompoc, CA (US)

(73) Assignee: Lockheed Martin Corporation, Bethesda, MD (US)

(*) Notice: Subject to any disclaimer, the term of this patent is extended or adjusted under 35 U.S.C. 154(b) by 37 days.

(21) Appl. No.: 16/013,622

(22) Filed: Jun. 20, 2018

(65) Prior Publication Data
US 2019/0390317 A1 Dec. 26, 2019

(51) Int. Cl.
C23C 14/04 (2006.01)
B41M 5/00 (2006.01)

(52) U.S. Cl.
CPC ......... *C23C 14/042* (2013.01); *B41M 5/0047* (2013.01); *B41M 5/0064* (2013.01)

(58) Field of Classification Search
CPC .... C23C 14/04; C23C 14/042; B41M 5/0047; B41M 5/0064
See application file for complete search history.

(56) References Cited

U.S. PATENT DOCUMENTS

| | | | |
|---|---|---|---|
| 3,773,704 A | 11/1973 | Hall et al. | |
| 4,242,378 A | 12/1980 | Arai | |
| 4,586,980 A | 5/1986 | Hirai et al. | |
| 4,643,912 A | 2/1987 | Nakagawa et al. | |
| 4,663,192 A | 5/1987 | Hatakeyama et al. | |
| 5,059,454 A | 10/1991 | Todd et al. | |
| 5,362,362 A * | 11/1994 | Cunningham | D21C 5/025 162/5 |
| 5,368,902 A | 11/1994 | Todd et al. | |

(Continued)

FOREIGN PATENT DOCUMENTS

| | | | |
|---|---|---|---|
| CN | 103700784 A | | 4/2014 |
| JP | 9-132890 | * | 5/1997 |
| JP | 2000165996 A | | 6/2000 |

OTHER PUBLICATIONS

Ali, Adnan, et al., "Printed Patterns Adhesion dependency on Contact Angle of Ink on Substrate". International Journal of Engineering & Technology IJET-IJENS vol. 10 No. 01, pp. 72-75.*

(Continued)

*Primary Examiner* — Bret P Chen
(74) *Attorney, Agent, or Firm* — Baker Botts L.L.P.

(57) ABSTRACT

According to certain embodiments, a method of producing a pattern on a substrate comprises securing a flexible polymeric substrate, printing a layer of ink as a negative pattern on the substrate, and placing the flexible polymeric substrate in a vacuum chamber. The method further includes uniformly applying, while the flexible polymeric is under a vacuum in the vacuum chamber, a layer of material over both the layer of ink and the substrate via physical vapor deposition and then removing the flexible polymeric substrate from the vacuum chamber. The method further includes removing the ink and material applied over the ink by immersing the flexible polymeric substrate in a solvent such that it results in a desired pattern of the material on the flexible polymeric substrate.

12 Claims, 4 Drawing Sheets

(56) References Cited

U.S. PATENT DOCUMENTS

| | | | |
|---|---|---|---|
| 7,156,945 B2 | 1/2007 | Chaug et al. | |
| 7,261,920 B2 | 8/2007 | Haubrich et al. | |
| 8,002,948 B2 | 8/2011 | Haubrich et al. | |
| 8,677,929 B2 | 3/2014 | Berger et al. | |
| 2008/0047930 A1 | 2/2008 | Blanchet et al. | |
| 2009/0191355 A1* | 7/2009 | Lee | B82Y 10/00 |
| | | | 427/535 |
| 2009/0191356 A1* | 7/2009 | Lee | H05K 3/102 |
| | | | 427/535 |
| 2011/0290304 A1* | 12/2011 | Daniel | H01L 31/03926 |
| | | | 136/251 |
| 2014/0070197 A1 | 3/2014 | Sato et al. | |
| 2016/0007477 A1* | 1/2016 | Yoshihara | H05K 3/207 |
| | | | 174/257 |
| 2018/0030599 A1* | 2/2018 | Stremsdoerfer | C25D 5/022 |
| 2018/0182741 A1* | 6/2018 | Sung | H01L 25/0753 |

OTHER PUBLICATIONS

Merilampi, S., et al., "The characterization of electrically conductive silver ink patterns on flexible substrates". Microelectronics Reliability, vol. 49, Issue 7, Jul. 2009, pp. 782-790.*

Balliu, Enkeleda, et al., "Selective laser sintering of inkjet-printed silver nanoparticle inks on paper substrates to achieve highly conductive patterns". Scientific Reports 8, 10408 (2018) doi:10.1038/s41598-018-28684-4, pp. 1-9.*

* cited by examiner

# METHODS AND SYSTEMS FOR GENERATING PATTERNS ON FLEXIBLE SUBSTRATES

TECHNICAL FIELD

The invention relates generally to rapid production of material patterns on flexible substrates using an ink-based liftoff process.

BACKGROUND

Conventional deposition techniques may only be suitable for applying a selected material to a small area of a substrate and are time consuming. For instance, photolithography-generated patterns, a common technique, requires a photosensitive material to be exposed to a light for a period of time under an expensive one-to-one photomask that becomes large as the pattern increases in size. After the photosensitive material has cured, the undesired material is removed using a relatively toxic substance. Much of this process must be performed in a clean room for highly controlled production. For reproduction of patterns over an area larger than several inches wide, this process may not be practical or even feasible. Another conventional technique, laser ablation, also has certain drawbacks. Namely, the production rate is slow and is limited by the amount of material to be removed by the focused laser, production costs are high, and is generally not suitable as a technique for preparing large pieces.

SUMMARY OF THE DISCLOSURE

According to certain embodiments, a method of producing a pattern on a substrate includes securing a flexible polymeric substrate, printing a layer of ink as a negative pattern on the flexible polymeric substrate, and placing the flexible polymeric substrate in a vacuum chamber. The method further includes uniformly applying, while the flexible polymeric is under a vacuum in the vacuum chamber, a layer of material over both the layer of ink and the substrate via physical vapor deposition and then removing the flexible polymeric substrate from the vacuum chamber. The method further includes removing the ink and material applied over the ink by immersing the flexible polymeric substrate in a solvent such that it results in a desired pattern of the material on the flexible polymeric substrate.

According to certain embodiments, a method of producing a pattern on a substrate includes securing a substrate, printing a layer of ink as a negative pattern on the substrate, and placing the substrate in a vacuum chamber. The method further includes applying, while the substrate is under a pressure in the vacuum chamber, a layer of material over the layer of ink and over the substrate via physical vapor deposition and then removing the substrate from the vacuum chamber. The method further includes removing the ink and material applied over the ink by immersing the substrate in a solvent such that it results in a desired pattern of the material on the substrate.

According to certain embodiments, an apparatus for producing patterns on a flexible substrate includes a printing station, an application station, a liftoff station, and a drying station. The printing station is configured to print a layer of ink in a negative pattern on the flexible polymeric substrate and the application station is configured to apply a uniform later of material over both the layer of ink and the flexible polymeric substrate using a physical vapor deposition technique. The liftoff station is configured to remove both the ink and the material applied over the negative pattern of ink by immersing the flexible polymeric substrate in a solvent. Immersing the flexible polymeric substrate in the solvent removes the ink and the material applied over the negative pattern of ink such that a desired pattern of the material is left on the flexible polymeric substrate. The drying station is configured to dry the flexible polymeric substrate and the desired pattern of the material by removing any leftover solvent.

Certain embodiments may provide one or more technical advantages. As an example, certain embodiments provide advantages for more rapid production of material deposition in a desired pattern and roll-to-roll production on a substrate. As another example, certain embodiments provide for enabling the deposition of material over a large and flexible substrate. Another example advantage may provide a more environmentally-safe process for producing patterned materials. Certain embodiments may include all, some, or none of the above-described advantages. Other advantages will be apparent to those of ordinary skill in the art.

BRIEF DESCRIPTION OF THE DRAWINGS

For a more complete understanding of the present disclosure, reference is now made to the following description, taken in conjunction with the accompanying drawings, in which.

DETAILED DESCRIPTION

The following description is presented to enable one of ordinary skill in the art to make and use the invention. Descriptions of specific embodiments and applications are provided only as examples and various modifications will be readily apparent to those skilled in the art. The general principles described herein may be applied to other embodiments and applications without departing from the scope of the invention. Thus, the present invention is not to be limited to the embodiments shown, but is to be accorded the widest scope consistent with the principles and features described herein. For purpose of clarity, details relating to technical material that is known in the technical fields related to the invention have not been described in detail.

Figure 1:
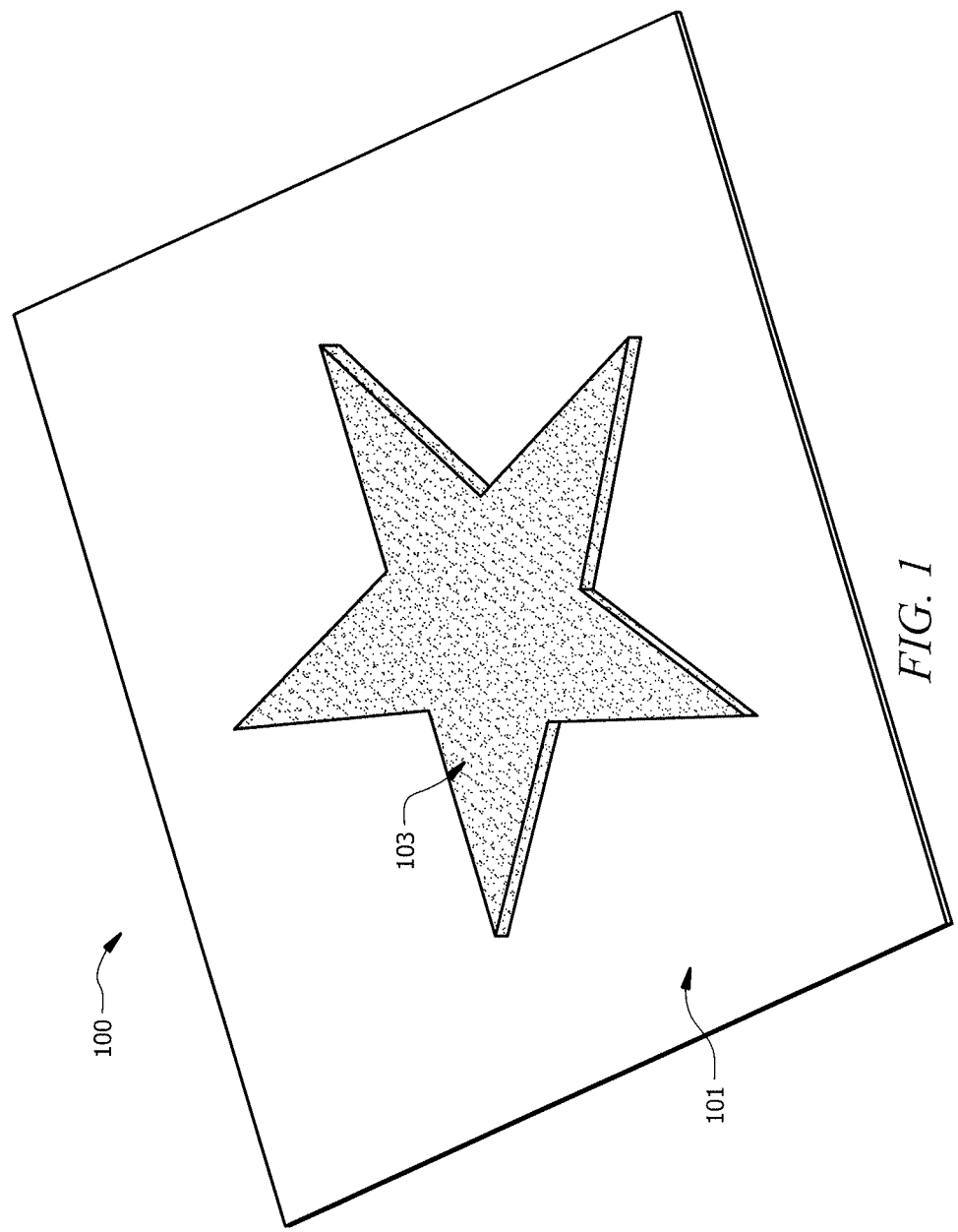
FIG. 1 illustrates an example embodiment of the finished deposition process resulting in the star-shaped pattern of a selected material on a flexible substrate.

FIG. 1 illustrates and example embodiment of a finished product 100 of a pattern of material 103 deposited on a substrate 101. The particular pattern of material 103 employed in FIG. 1 may be recognized as a star-shaped pattern, but any desired pattern may be formed using the disclosed technique. Pattern of material 103 may be built up to a desired thickness on the surface of substrate 101. This thickness may be better understood with respect to FIGS. 2A-2D and will be described therein. Producing patterns of material on large substrates can be challenging for conventional deposition techniques. For example, substrate 101 may be larger than one square foot. Using an inkjet printing process to apply a negative mask of water-based inks based on a desired computer aided drafting ("CAD") design allows, as disclosed, a layer of desired material to be applied to the flexible substrate and then the undesired portions of the pattern may be removed. The disclosed technique may have the advantage of enabling the deposition of a pattern of material 103 including metal, dielectric, or compounded materials applied to a desired thickness. As another example advantage, the disclosed technique may enable the deposition of certain materials on a flexible substrate 101 such as Kevlar, polycarbonate sheets, or other polymer materials. Another advantage that may be realized by the disclosed technique is a more environmentally safe process that may be accomplished using only water-based inks and solvents as opposed to conventional techniques such as photolithography or laser ablation.

Figure 2A:
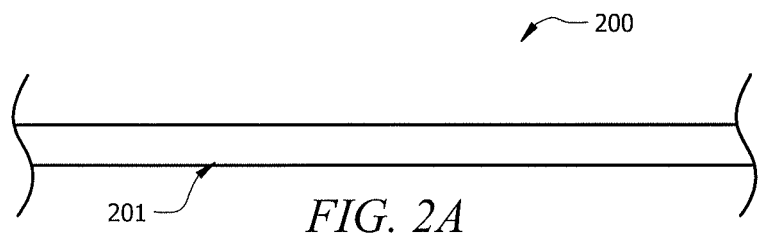
FIGS. 2A-2D illustrates an example sequence of steps for generating a pattern of material on a flexible substrate, such as the one illustrated in FIG. 1.
Figure 2B:
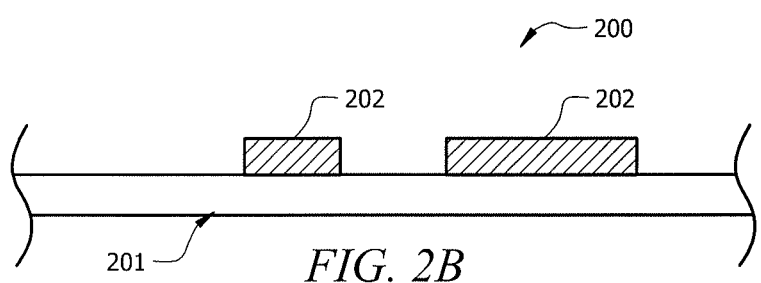
Figure 2C:
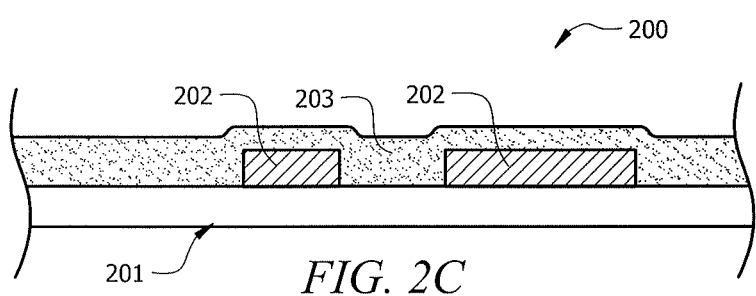
Figure 2D:
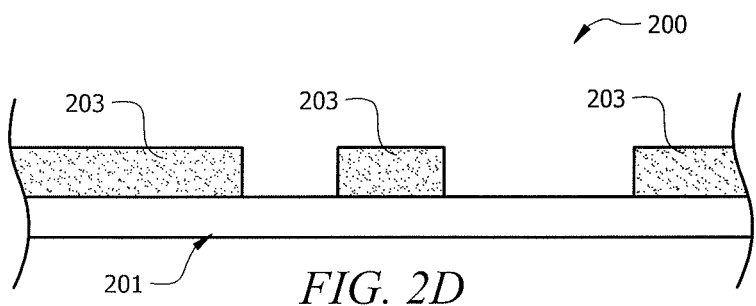
Figure 3:
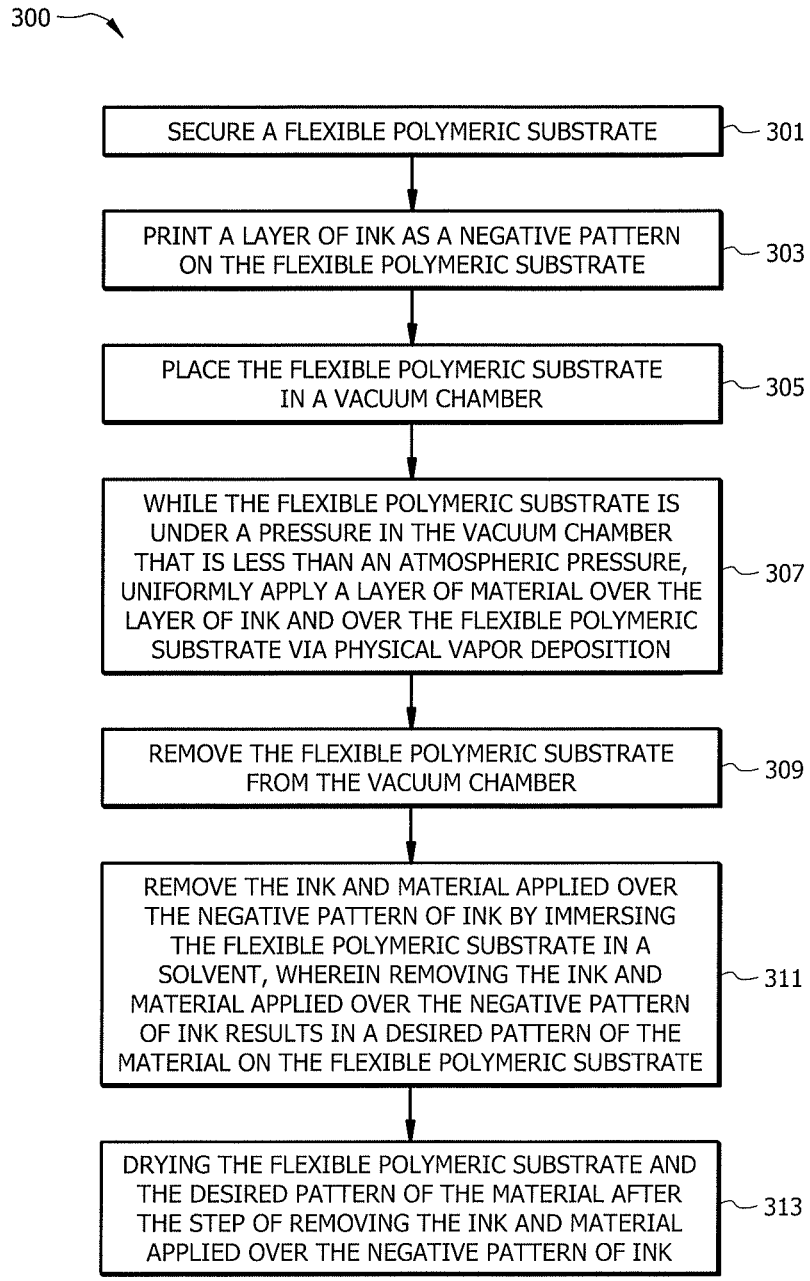
FIG. 3 is a flowchart illustrating an example series of steps for generating a pattern of material on a flexible substrate, such as the one illustrated in FIGS. 1-2D.
Figure 4:
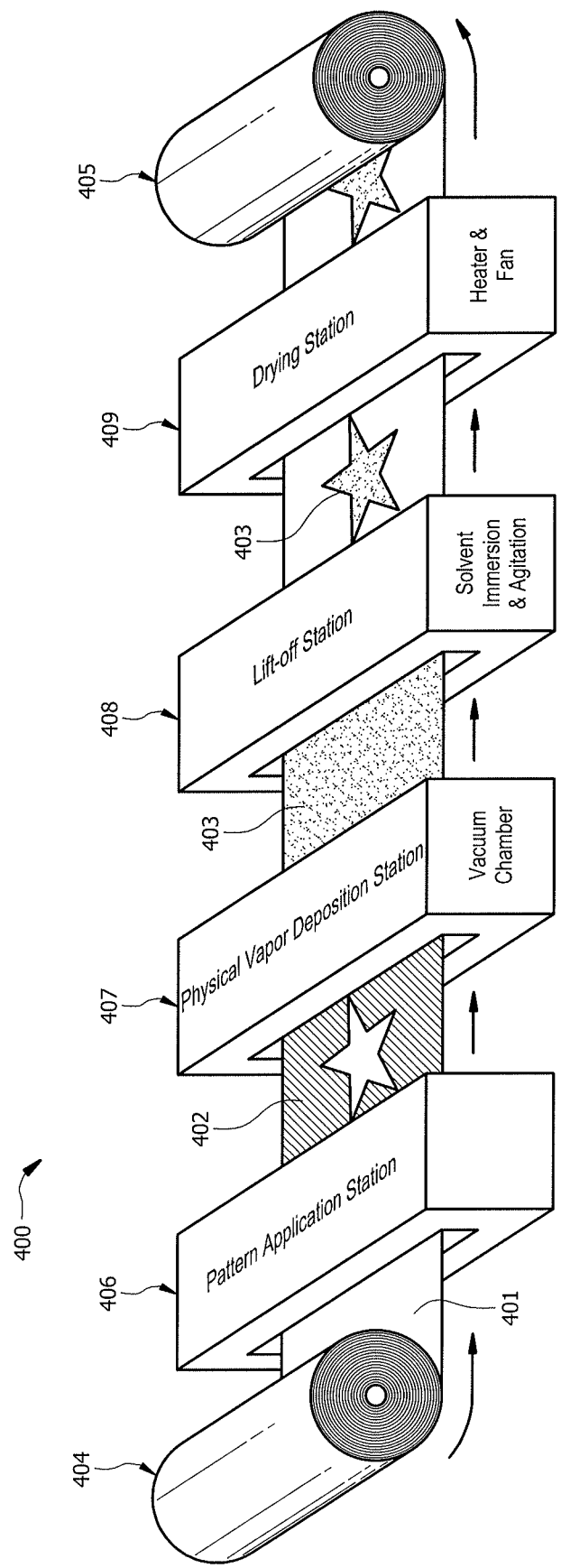
FIG. 4 illustrates an apparatus for generating a pattern of material on a roll-to-roll substrate, such as the pattern of FIG. 1, by performing certain processes, such as those illustrated in FIGS. 2A-2D or as described in FIG. 3.

The finished product 100 was achieved using a technique such as the one described in further detail with respect to FIGS. 2A-3. The pattern as illustrated in FIG. 1 may be the completed step of the deposition technique corresponding to the step illustrated in FIG. 2D. The example finished product 100 may also be produced using an apparatus such as the example roll-to-roll apparatus for generating a pattern of material as illustrated in FIG. 4.

FIG. 2A illustrates product 200 before any material has been applied to substrate 201. In some embodiments, substrate 201 may be a flexible substrate. For example, substrate 201 may be a Kevlar film, Kevlar paper, or a polycarbonate film. Depending on the characteristics of substrate 201, certain pre-treatments may be used to make substrate 201 more receptive to the deposition of the material. For example, with a hydrophobic substrate 201 an ozone treatment or an oxygen plasma method may be used to prepare the surface of the substrate 201.

Because substrate 201 may be a flexible substrate 201, it may be preferable to secure the substrate 201 in place for the various operations of producing the finished product. Flexible substrate 201 may be made less rigid using any appropriate technique, for example, substrate 201 may be secured to a backing using a material that is more rigid than substrate 201 using a spray-on polymer (e.g., polyvinyl alcohol) or self-adhesive backing. As another example, substrate 201 may be secured using edge tensioning or may be tensioned by rollers and/or idlers.

FIG. 2B illustrates a following step to performing the pattern generation technique. As illustrated, a mask or negative pattern of ink 202 may be deposited on the surface of substrate 201. Negative pattern of ink 202 may be deposited on substrate 201 using any appropriate process such as an ink-jet printing process or a laser draft printing process. In certain embodiments, negative pattern of ink 202 may be set over substrate 201 via a commercially available ink-jet plotter. As described above with respect to FIG. 1, the negative pattern may be provided to an ink-jet printer from a CAD file that includes either the negative pattern or the desired pattern. As illustrated, negative pattern of ink 202 may be discontinuous and does not have to be connected as a single mask. For example, to produce an "0" shaped pattern of material, negative pattern of ink 202 may fill in the outer part of the circle and the inner part of the circle without connecting the two portions of negative pattern of ink 202.

The thickness of negative pattern of ink 202 may be controlled based on the volume of ink deposited, the dry time, and other properties of the ink (e.g., different surfactant based on the amount of dye or pigment, wax content, and water-solubility of the ink). In some embodiments, the thickness of negative pattern of ink 202 may range from one to one-and-a-half microns above the surface of substrate 201.

FIG. 2C illustrates the next step to performing the pattern generation technique where a layer of selected material 203 is deposited over both substrate 201 and negative pattern of ink 202. In certain embodiment, the layer of selected material 203 may be uniform. The deposited material 203 may be a metallic material thus providing for metallization of substrate 201. In certain embodiments, the selected material 203 may be a voltaic layer of metal, a compound, a dielectric (e.g., silicon monoxide) or other desired material.

To apply the selected material 203, the secured substrate 201 along with negative pattern of ink 202 on the surface of substrate 201 may be placed into a vacuum chamber. The selected material 203 may be deposited using a physical vapor deposition ("PVD") technique. The application of the selected material 203 covers both the exposed surface of the substrate 201 and negative pattern of ink 202. The applied material 203 forms a continuous layer and is conformal to the topography of negative pattern of ink 202 and substrate 201. The thickness of negative pattern of ink 202 as determined with respect to the description of FIG. 2B may be further determined based on the desired thickness of the selected material to generate the finalized product. For example, a negative pattern of ink 202 with a thickness greater than the thickness of the deposited material 203 may be preferred for more complete removal of the deposited material 203 in subsequent step (i.e., the step as described related to FIG. 2D). In certain embodiments, the thickness of negative pattern of ink 202 may range from one to one-and-a-half microns as compared to the range of thicknesses of the deposited material on the order of one to two thousand angstroms (0.1 microns to 0.2 microns) of material 203. The thickness of negative pattern of ink 202 and material 203 are not to scale as illustrated in FIGS. 2A-2D.

FIG. 2D illustrates the completed product 200 after removing negative pattern of ink 202 and the excess material 203 applied atop negative pattern of ink 202. Negative pattern of ink 202 may be removed using various techniques. For example, negative pattern of ink 202 and the excess material 203 applied atop negative pattern of ink 202 may be removed manually as a mask, immersion into an appropriate solvent (e.g., water for water-based inks 202), spraying product 200 with water, ultrasonic agitation, mechanical agitation, or any combination thereof.

These techniques may serve to remove negative pattern of ink 202 and thus also remove only the deposited material 203 that was applied atop negative pattern of ink 202 while leaving material 203 deposited directly on substrate 201 intact. In embodiments where product 200 was exposed to a solvent, either via immersion or by subjecting product 200 to a jet of solvent, substrate 201 and desired pattern of material 203 may be subsequently dried to remove any excess solvent. The drying process may be either passive (e.g., setting product 200 aside so that it can dry on its own), or by assisted drying (e.g., using a gas stream such as hot air directed over the finished product 200).

FIG. 3 is a flow chart detailing a method 300 of performing the pattern generation technique. In step 301, substrate 201 may be secured as detailed above with respect to FIG. 2A. After securing substrate 201, the next step 303 includes printing a layer of ink as a negative pattern 202 on the polymeric substrate 201. Step 303 may be accomplished using any of the various methods described above with respect to FIG. 2B.

In step 305, substrate 201 and negative pattern of ink 202 are all placed within a vacuum chamber for material deposition. In step 307, while substrate 201 and negative pattern of ink 202 are within the vacuum chamber and subjected to a pressure that is less than atmospheric pressure, a uniform layer of material 203 may be applied conformally over both negative pattern of ink 202 and substrate 201. For instance, the application of material 203 in step 307 may be performed by PVD.

After applying the uniform later of material 203, the combined product 200 including substrate 201, negative pattern of ink 202, and applied material 203 may be removed from the vacuum chamber as step 309. After being removed from the vacuum chamber, in step 311 negative pattern of ink 202 and the excess material 203 atop negative pattern of ink 202 are removed from substrate 201 resulting in the desired pattern of material 203 remaining on substrate 201. The removal process of step 311 may be carried out using any combination of the techniques for removing negative pattern of ink 202 and excess material 203 atop negative pattern of ink 202 as described with respect to FIG. 2D above. Lastly, in step 313, the finished product 200 may be dried to remove any residual solvent from step 311. Drying of the finished product 200 may be performed by any technique commonly understood by those skilled in the art.

The method described with respect to FIG. 3 may have more or fewer steps, and the steps may be performed in any suitable order. As an example, step 313 may be optional in certain embodiments (e.g., where negative pattern of ink 202 is removed with a solvent-free technique). As another example, steps 305 and 309 may be optional in certain embodiments (e.g., where each of the steps 301-313 may be accomplished without employing a vacuum chamber for particular deposition techniques). In certain other embodiments, step 305 may be performed before step 301 and step 309 may be performed after step 313 (e.g., where all of the steps occur within a vacuum chamber).

FIG. 4 illustrates an example embodiment of an apparatus 400 for continuously producing patterns of material 403 on a flexible substrate 401 using various stations and a pair of roll-to-roll rollers. In some embodiments, the stations may include a pattern application station 406, a physical vapor deposition station 407, a lift-off station 408, and a drying station 409. Certain station may be combined into a multi-function station. In certain embodiments, all of the stations may also be combined into a single station. The apparatus or roll-to-roll coater 400 may also have a pair of rollers, a feed roll 404 and a receiving roll 405, where each is a roll of flexible substrate 401 such as Kevlar. After a full feed roll 404 has been consumed it may be replaced with a new feed roll 404 to continuously produced desired patterns of material 403.

From feed roll 404 a continuous supply of a flexible substrate 401 is fed to apparatus 400. The first station that substrate 401 passes through is a pattern application station 406 where a negative pattern of ink 402 is printed on substrate 401. Pattern application station 406 may use an ink application technique as described above with respect to FIGS. 1-3.

After exiting pattern application station 406, substrate 401 with printed negative pattern of ink 402 passes to a physical vapor deposition station 407 for metallization of substrate 401. In certain embodiments, physical vapor deposition station 407 may also be a vacuum chamber. In certain other embodiments, apparatus 400 may be entirely within a vacuum chamber. During the metallization of substrate 401 at physical vapor deposition station 407 a uniform contoured coating of material 403 is deposited over both substrate 401 and negative pattern of ink 402.

After the metallization process at physical vapor deposition station 407, substrate 401 with coating of material 403 travels to a lift-off station 408. Here, negative pattern of ink 402 and the excess material 403 deposited directly on top of negative pattern of ink 402 is removed from substrate 401 leaving behind only the desired pattern of material 403 on substrate 401. Lift-off station 408 may use any ink removal technique discussed with respect to FIG. 2D and FIG. 3 above to remove negative pattern of ink 402 and excess material 403.

Once the desired pattern of material 403 has been revealed on substrate 401, material 403 and substrate 401 may pass through a drying station 409. Drying station 409 may remove any residual solvents from lift-off station 408. In some embodiments, actively drying the finished product may be important for the roll-to-roll process. As the pattern of material 403 and substrate 401 are collected back into a roll in receiving roll 405 any passive drying may be reduced depending on how tight of a roll is used.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

Although the present disclosure includes several embodiments, a myriad of changes, variations, alterations, transformations, and modifications may be suggested to one skilled in the art, and it is intended that the present disclosure encompass such changes, variations, alterations, transformations, and modifications as fall within the scope of the appended claims.

The invention claimed is:

1. A method of producing a pattern on a substrate, the method comprising:
   securing a flexible polymeric substrate;
   printing a layer of ink as a negative pattern on the flexible polymeric substrate;
   placing the flexible polymeric substrate in a vacuum chamber;
   while the flexible polymeric substrate is under a pressure in the vacuum chamber that is less than an atmospheric pressure, uniformly applying a layer of material over the layer of ink and over the flexible polymeric substrate via physical vapor deposition;
   removing the flexible polymeric substrate from the vacuum chamber; and
   removing the ink and material applied over the negative pattern of ink by:
      immersing the flexible polymeric substrate in a solvent; and
      utilizing one of at least ultrasonic agitation and mechanical agitation, wherein removing the ink and material applied over the negative pattern of ink results in a desired pattern of the material on the flexible polymeric substrate.

2. The method of claim 1, wherein the thickness of the layer of ink is greater than the thickness of the layer of applied material.

3. The method of claim 1, wherein the flexible polymeric substrate is Kevlar.

4. The method of claim 1, wherein the applied material comprises one of a metallic material, a dielectric material, and a compounded material.

5. The method of claim 1, wherein the ink is a water-based ink and the solvent is water.

6. The method of claim 1, wherein printing the layer of ink comprising printing using an inkjet printing process.

7. The method of claim 1, further comprising drying the flexible polymeric substrate and the desired pattern of the material after the step of removing the ink and material applied over the negative pattern of ink.

8. A method of producing a pattern on a substrate, the method comprising:
- securing a substrate;
- printing a layer of ink as a negative pattern on the substrate;
- placing the substrate in a vacuum chamber;
- while the substrate is under a pressure in the vacuum chamber that is less than an atmospheric pressure, applying a layer of material over the layer of ink and over the substrate via physical vapor deposition;
- removing the substrate from the vacuum chamber; and
- removing the ink and material applied over the negative pattern of ink by:
  - immersing the substrate in a solvent; and
  - utilizing one of at least ultrasonic agitation and mechanical agitation, wherein removing the ink and material applied over the negative pattern of ink results in a desired pattern of the material on the substrate.

9. The method of claim 8, wherein the substrate comprises a flexible polymeric substrate.

10. The method of claim 8, wherein applying the layer of material comprises uniformly applying the layer of material.

11. The method of claim 8, wherein the applied material comprises one of a metallic material, a dielectric material, and a compounded material.

12. The method of claim 8, wherein printing the layer of ink comprising printing using an inkjet printing process.

* * * * *